United States Patent [19]

Taylor

[11] Patent Number: 4,807,266
[45] Date of Patent: Feb. 21, 1989

[54] CIRCUIT AND METHOD FOR PERFORMING EQUAL DUTY CYCLE ODD VALUE CLOCK DIVISION AND CLOCK SYNCHRONIZATION

[75] Inventor: Mark Taylor, Houston, Tex.

[73] Assignee: Compaq Computer Corporation, Houston, Tex.

[21] Appl. No.: 101,946

[22] Filed: Sep. 28, 1987

[51] Int. Cl.[4] ............... H03K 21/10; H03K 23/70; H03K 23/50
[52] U.S. Cl. .................... 377/48; 377/108; 328/55; 328/58; 307/272.1
[58] Field of Search ............ 377/47, 48; 328/60, 328/61, 63, 55, 58, 72, 74; 307/269, 271, 272.1

[56] References Cited

U.S. PATENT DOCUMENTS

| 3,873,815 | 5/1975 | Summers | 377/47 |
| 3,943,379 | 3/1976 | McGriffin | 377/47 |
| 4,330,751 | 5/1982 | Swain | 328/58 |
| 4,336,394 | 12/1982 | Clendenning et al. | 377/47 |
| 4,560,939 | 12/1985 | Dekarske et al. | 328/72 |
| 4,651,103 | 3/1987 | Grimes | 328/55 |
| 4,656,649 | 4/1987 | Takahashi | 377/48 |
| 4,703,495 | 10/1987 | Bereznak | 377/47 |

FOREIGN PATENT DOCUMENTS

| 0003228 | 1/1985 | Japan | 377/47 |
| 0248020 | 12/1985 | Japan | 377/47 |

OTHER PUBLICATIONS

EDN, Divider Produces Symmetrical Output, Jan. 23, 1986, p. 212.
Traditional Approaches to Sequential Analysis and Design, Counters, pp. 386-405.
Compaq Computer Corp., Deskpro 386 Technical Reference Manual, pp. 2-33 and 2-34.
Compaq Computer Corp., Detailed Processor Descriptions, pp. 10 and 11 and relating to PAL design.

Primary Examiner—John S. Heyman
Assistant Examiner—Tai V. Duong
Attorney, Agent, or Firm—Pravel, Gambrell, Hewitt, Kimball & Krieger

[57] ABSTRACT

A circuit for dividing a master clock by an odd integral value and producing a 50% duty cycle. A state machine develops set and clear signals which are of a timing proportion of n: n+1, where 2n+1 is the divisor value. The set signal is provided to one input of a bistable multivibrator or S-R latch to set the multivibrator to a given state, while the clear signal is combined with the master clock signal to delay or disable the clearing of the multivibrator by ½ count of the master clock, so that an n+½: n+½ proportion output clock signal is developed. Additionally, the circuit includes a state machine which determines which of a series of differing frequency master clock signals is active and when an external triggering event occurs so that the following rising edge of the output clock signal is delayed until a determined time after the triggering event to allow synchronization of the output clock signal.

30 Claims, 5 Drawing Sheets

CIRCUIT AND METHOD FOR PERFORMING EQUAL DUTY CYCLE ODD VALUE CLOCK DIVISION AND CLOCK SYNCHRONIZATION

BACKGROUND OF THE INVENTION

1. Field of the Invention

The invention relates to circuits used with clocking signals, especially those designed to divide the clocking signal and to synchronize the divided signal with an external event.

2. Description of the Prior Art

In many electronic circuits, particularly those utilizing digital electronics and computers, it is necessary to produce clock signals having a number of different frequencies. It is generally desirable to use the lowest frequency master clock signal possible so that lower cost and lower performance processes can be used. To this end, it is often desirable that a master clock signal be divided by an odd integral value to produce one of the lower rate clock signals used elsewhere in the system or device.

In the past, one problem has been that conventional circuits which perform an odd division do not result in an output clock signal having a 50% duty cycle but rather generally have an n: n+1 duty cycle, where 2n+1 is the divisor value. If a 50% duty cycle divided clock signal was necessary, the master clock signal frequency had to be doubled so that there was an even division. This double rate master clock signal required the use of higher performance and higher cost processes throughout the circuits and the device.

An alternative to an integral division was the asynchronous generation of the lower rate clock signal. This was generally done using a separate crystal and associated circuitry to develop the clock signal. This need for additional components increased the expense of the device as compared to a simple division circuit and resulted in asynchronous clock signals. If there was a necessity for synchronizing the various clock signals appearing in the device, the asynchronous generation required separate, generally complex, synchronizing circuitry. Generally the synchronizing circuitry would require the insertion of a large number of wait states or delays into one or both of the clock signals to synchronize the two clock signals. This insertion of numerous wait states resulted in long delays and therefore degradation of the performance of the device. The situation was further complicated if the clock signal had to be synchronized to any one of a plurality of master clocking signals so that the clock signal being synchronized would have to be delayed or held for a variable number of counts or cycles depending upon the frequency of the master clock signal.

It is therefore desirable to have a circuit which allows an odd valued division of a clock signal and yet produces a 50% duty cycle output and additionally allows easy synchronization of a divided clock signal with one of a plurality of master clock signals.

SUMMARY OF THE INVENTION

The circuit of the present invention provides a method and mean for dividing a master clock signal by an odd integral value and producing an output signal having a 50% duty cycle and a method and means for allowing a divided clock signal to be synchronized to a master clock signal from which it is divided, the master clock signal having one of a plurality of frequencies.

The odd division is performed by using a synchronous state machine coupled to a bistable multivibrator or S-R latch. The state machine produces a set pulse to fix the output of the S-R latch to a high output condition. The set condition of the S-R latch is maintained for n master clock signal cycles, at which time the state machine produces a clear pulse intended to clear or reset the S-R latch so that the S-R latch has a low output value. This clear pulse is at least one master clock signal cycle long. This clear pulse is delayed or disabled for ½ master clock signal cycle by combining the clear pulse with the requirement that the master clock signal be low. This requirement results in the S-R latch not changing states until the second half of the n+1 master clock signal cycle so that the resulting output of the S-R latch is a wave form having a 50% duty cycle and a ratio of n+½:n+½. The divisor and the ratio are varied by changing the number of master clock signal cycles between the set pulse and the clear pulse and the clear pulse and the set pulse. By appropriately varying the occurrence of these pulses, the circuit can divide by any odd number and produce a 50% duty cycle output clock signal.

The circuit of the present includes a subcircuit for delaying the rising edge of a divided output clock signal until after at least a given interval from a triggering or synchronization event. This delay is accomplished by varying the number of states or clock cycles between a clear pulse which actuates the falling edge of the output clock signal and a set pulse which triggers the rising edge of the output clock signal. A state machine is used which evaluates which one of a plurality of different frequency master clock signals is clocking the device and when the triggering action is requested in relation to the output clock signal state. The number of states the output clock signal is held in a low condition varies depending upon the frequency of the master clock signal and the state of the state machine at which the synchronization request was received or first evaluated.

BRIEF DESCRIPTION OF THE DRAWINGS

FIG. 5 is a logic diagram of a state machine for producing 50% duty cycle clock signals and synchronizing clocks according to the present invention.

FIG. 6a-6d are Karnaugh maps used to derive the state machine of FIG. 5.

DETAILED DESCRIPTION OF THE PREFERRED EMBODIMENT

Figure 1:
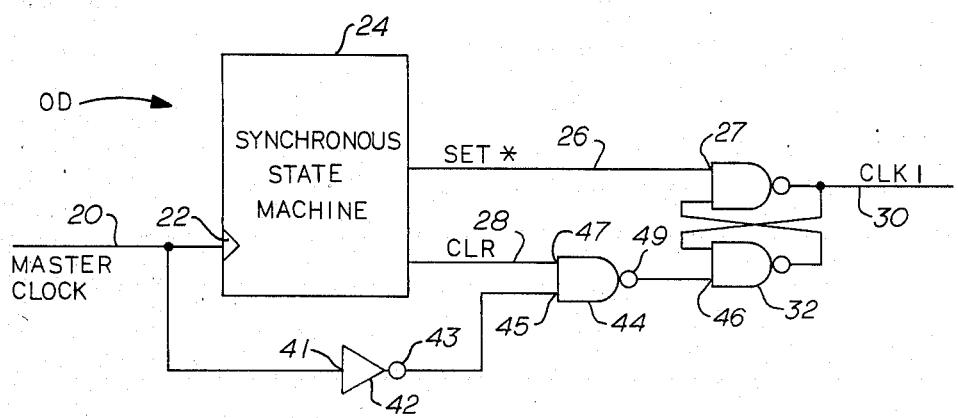
FIG. 1 is an electrical schematic block diagram of a 50% duty cycle circuit according to the present invention.

Referring now to FIG. 1, the letters OD generally signify an odd division circuit according to the present invention. A MASTER CLOCK signal 20, which has approximately a 50% duty cycle, is provided to the clocking input 22 of a synchronous state machine 24. The state machine 24 provides a SET* signal 26 and a CLR signal 28 which are used generally to control the rising edge and falling edge, respectively, of the output clock or CLK1 signal 30. The use of an asterick after a signal name in this description generally indicates that the active state of the signal is a low state, rather than the conventional high state, or that the signal is the inverse of the signal referred to without an asterisk. The SET* signal 26 is provided to one input 27 of a bistable multivibrator or S-R latch 32 so that when the SET* signal 26 goes low (FIG. 2) and forms a low pulse 34, the CLK1 signal 30 goes high 36. This provides the rising edge of the CLK1 signal 30 and therefore the beginning of an output clock cycle. The SET* signal 26 then returns to a high state 38 after one count or cycle of the MASTER CLOCK signal 20 so that the CKL1 signal 30 can be triggered by a signal provided to a second input 46 of the S-R latch 32 to switch to a cleared or low state 40.

Figure 2:
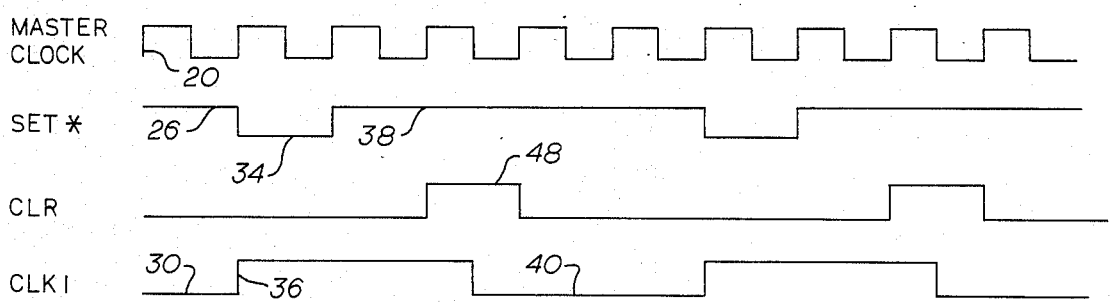
FIGS. 2 and 3 are wave form illustrations of the circuit of FIG. 1.

The MASTER CLOCK signal 20 is provided to the input 41 of an inverter 42 whose output 43 is connected to one input 45 of a two-input NAND gate 44. The CLR signal 28 is provided to the other input 47 of the NAND gate 44. The output 49 of the NAND gate 44 is connected to the second input 46 of the S-R latch 32. Therefore, when the output of the NAND gate 44 goes low and the SET* signal 26 is at a high state, the CKL1 signal 30 goes low. This initiates the alternate half of the duty cycle of the CKL1 signal 30. As shown in FIG. 2, the CLR signal 28 preferably has a high output 48 for one cycle of the MASTER CLOCK signal 20.

The relationship between the SET* signal 26 and the CLR signal 28 is such that the active or falling edge of the SET* signal 26 occurs two MASTER CLOCK signal cycles before the rising edge of the CLR signal 28 which in turn occurs three MASTER CLOCK signal cycles before the next falling edge of the SET* signal 26. This would ordinarily result in a 2:3 or n:n+1 division where n=2, if not for the action of the NAND gate 44. The combination of the CLR signal 28 and the inverted MASTER CLOCK signal by the NAND gate 44 results in the CLR signal 28 being delayed or partially disabled so that the falling edge which activates or clears the S-R latch 32 is delayed by $\frac{1}{2}$ MASTER CLOCK cycle. Because the proportion between the halves of the duty cycles of the CKL1 signal 30 as would be produced simply by connection of the SET* signal 26 and the CLR signal 28 to the S-R latch 32 is n:n+1, this $\frac{1}{2}$ cycle delay or disabling results in a duty cycle of n+$\frac{1}{2}$:n+$\frac{1}{2}$, or approximately 50%. This 50% duty cycle odd division is accomplished without the need for a double frequency clock and therefore allows simpler process components to be utilized, lowering the cost of the device. Additionally, the use of the lower frequency clock reduces the electromagnetic interference levels present in the device, lessening regulatory costs.

Figure 3:
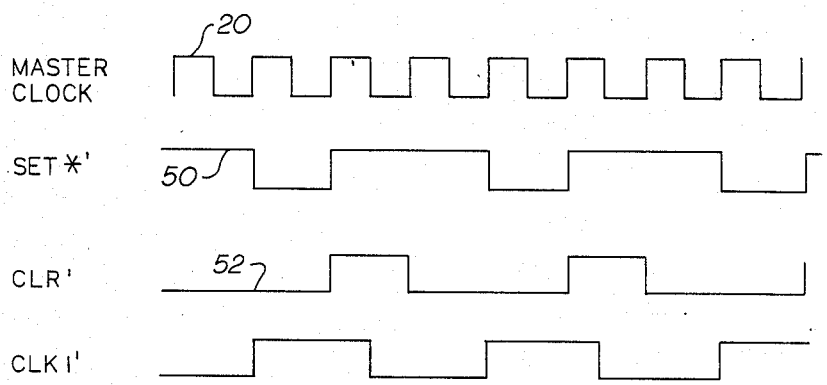

While FIG. 2 is a wave form illustration of a divide by five circuit, FIG. 3 shows the wave forms for a divide by three circuit wherein the falling edge of the SET*' signal 50 occurs one MASTER CLOCK signal 20 cycle before the rising edge of the CLR' signal 52 which in turn occurs two MASTER CLOCK signal 20 cycles before the falling edge of the SET*' signal 50. This results in a rough proportion of 1:2, which through the action of NAND gate 44 results in a final proportion of 1$\frac{1}{2}$:1$\frac{1}{2}$ or a 50% duty cycle.

Therefore it can be readily seen that the odd division circuit OD provides a simple circuit for producing a 50% duty cycle and odd division, allowing the use of a lower frequency master clock than would otherwise be obtainable.

Figure 4:
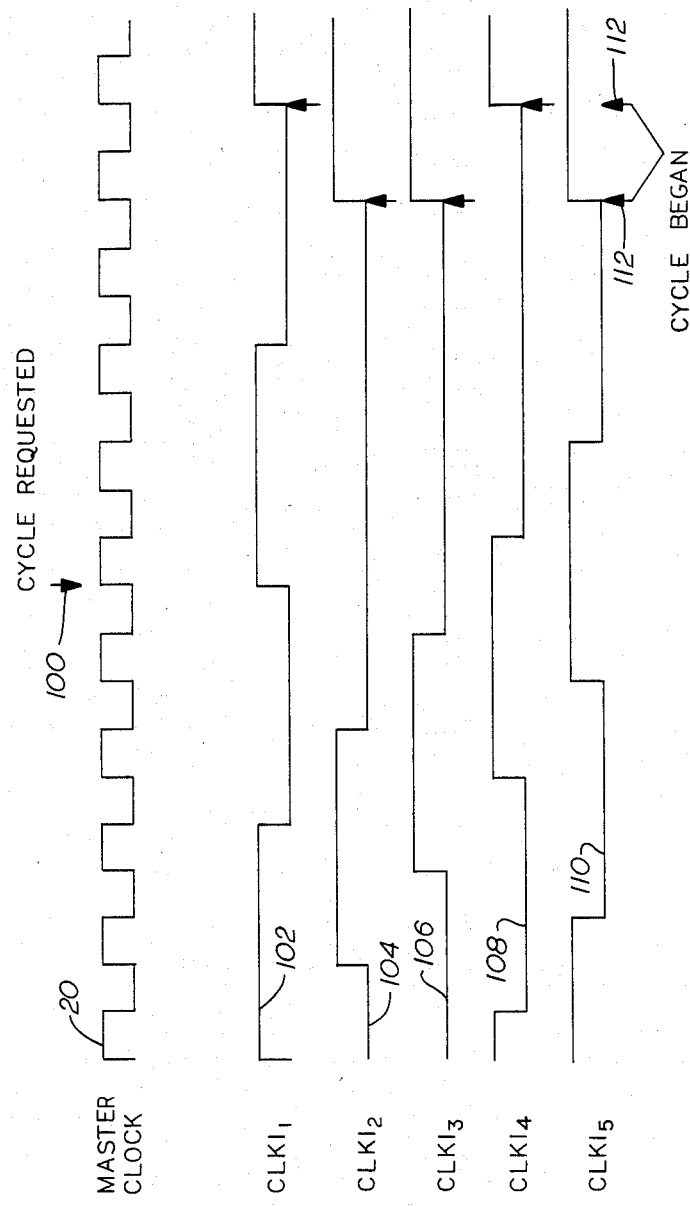
FIG. 4 is a wave form illustration of a circuit for synchronizing divided clock signals according to the present invention.

There are numerous circumstances where a divided clock signal must be synchronized to a master clock signal with the divided clock signal having certain conditions such that, for example, the next rising edge of the divided clock signal can occur only after a given minimum time interval after a triggering event or request, but should occur as soon as possible thereafter in order to avoid additional wait states. This situation is shown in FIG. 4 where the divided by five clock signal, as shown in FIG. 2, is shown as being appropriately delayed or synchronized based on a cycle request indication point 100.

Because the divided clock signal has been divided by five, there are five possibilities for the relationship between the CKL1 output signal and the MASTER CLOCK signal, so that five different synchronizing events or conditions exist. These conditions are shown in FIG. 4 as CKL1$_{1-5}$ output signals 102-110. For the purpose of this description, it can be assumed that the synchronizing requirements are such that the next rising edge of the divided clock signal cannot occur until the time represented by at least four MASTER CLOCK signal 20 cycles have passed. This does not present a problem in the cases of the CKL1$_1$ signal 102 or the CLK1$_5$ signal 110 in which the next rising edge of the divided clock occurs respectively six and five MASTER CLOCK signal 20 cycles after the triggering event appears, the rising edge being indicated by the cycle begin pointers 112. Under these conditions, the output clock signals can remain a constant 50% duty cycle without need for delaying the rising edge of the output clock signal or lengthening the low level portion of the duty cycle to accommodate the synchronizing event.

However, in the other three conditions of the divided output clock signal, there is a need for synchronization and because the conditions imposed are that the next rising edge must fall more than a given time interval after the triggering event, it is appropriate to stretch the low portion of the duty cycle and thereby delay the next rising edge of the divided output clock signal. This is preferably done by developing the wave forms as shown in FIG. 4.

Figures 5, 6A, 6B, 6C:
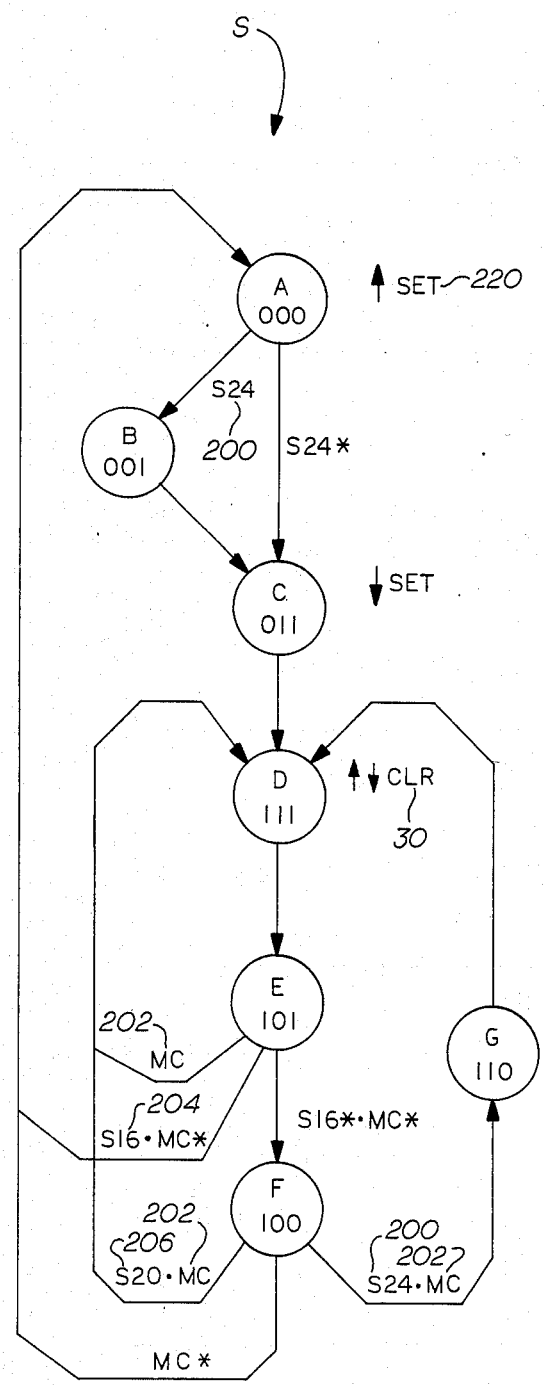

The requirements for synchronization are further complicated if the MASTER CLOCK signal can be one of a plurality of different frequencies and the next rising edge of the divided clock after the triggering event cannot occur until after a given time requirement, not a master clock cycle requirement. A state diagram of an embodiment of a circuit which allows three master clock signal frequencies to be divided down to produce an output clock signal having one frequency and being synchronized to the triggering event is shown in FIG. 5. In the preferred embodiment, the three MASTER CLOCK signal frequencies are 32, 40 and 48 MHz, which, in the preferred embodiment, correspond to microprocessor frequencies of 16, 20 and 24 MHz, the microprocessor operating at $\frac{1}{2}$ the MASTER CLOCK signal frequency.

According to the present invention this synchronization can be obtained by the use of a synchronous state machine. It is desirable that this state machine additionally provide the capability of the synchronous state machine 24 used in the odd division circuit OD to further reduce the part and component count of the circuitry forming the device. This state machine is generally referred to by the letter S (FIG. 5). As shown in the preferred embodiment, the state machine S contains seven states, A–G, thereby requiring the use of three bits to develop the state machine S.

The Karnaugh maps used to develop the appropriate inputs for the bistable multivibrators or flip-flops used to implement the state machine S are shown in FIGS. 6a–6d, where Q0 is the least significant bit of the code representing the state, Q2 is the most significant bit of the code representing the state, D0 is the input to the least significant flip-flop and D2 is the input to the most significant flip-flop.

The state machine S is best analyzed by reference to FIG. 5. The state machine S advances from one state to the next appropriate state on the rising edge of the MASTER CLOCK signal 20. State A corresponding to a Q2, Q1, Q0 value of 000 will be used as the starting or reference state. When state A occurs, the set signal 220 goes high, resulting in the SET* signal 26 going low and the triggering of the rising edge of the CKL1 signal 30. If 48 MHz is the active frequency of the MASTER CLOCK signal 20, the next state of the state machine S is state B, as shown by branching based on the state of the S24 signal 200. State B is used as a divider state because in the preferred embodiment the CLK1 output signal 30 frequency is 8 MHz, so that three states are needed for the high portion of the CKL1 signal 30 to provide a 50% duty cycle for the divide by six necessary to produce the 8 MHz clock signal. If the MASTER CLOCK signal 20 frequency is not 48 MHz or if the state machine S has been in state B, the next state of the machine S is state C, which has a value of 011. When the state machine leaves state C, the set signal 220 goes low and the SET* signal 26 goes high, releasing the S-R latch 32.

The next state of state machine S after state C is state D, having a value of 111. When this state is entered, the CLR signal 30 goes high resulting in the CKL1 signal going low, either immediately or after a ½ cycle delay, if the odd divide circuit OD is implemented. When the state machine S is used in combination with the odd divide circuit OD, after the next half clock cycle of the MASTER CLOCK signal 20, the CKL1 output 30 will go low, resulting in an n+½ high portion of the duty cycle.

The next state in the state machine S after state D and entered at the next cycle of the MASTER CLOCK signal 20 is state E, which has a value of 101. In this state, the CLR signal 30 goes low, thereby releasing the S-R latch 32 for the next occurrence of the SET* signal 26.

There are three possible exits from state E. The first exit results in a loop back to state D and is taken if the MYCYC or MC signal 202 is present, indicating that a synchronization request has been issued. This results in recycling the state machine S through states D and E, thereby extending the low portion of the CKL1 signal 30 by two MASTER CLOCK signal 20 cycles.

The second exit from state E is a loop back to state A and occurs if 32 MHz is the MASTER CLOCK signal frequency, as signified by an active S16 signal 204, and the MYCYC signal 202 is not high or asserted. This condition indicates that a full division cycle has been completed for the 32 MHz condition, such that a 8 MHz CKL1 signal 30 having approximately a 50% duty cycle is produced by this feedback to state A where the SET* signal 26 goes low.

The third output or exit from state E is to state F and this branch is taken when 32 MHz is not the MASTER CLOCK signal 20 frequency and there is no synchronization or MYCYC signal 202 asserted.

State F, which has a value of 100, has three exits. The first exit is a feedback or loop back to state D and is taken if 40 MHz is the MASTER CLOCK signal 20 frequency as indicated by the S20 signal 206 and the MYCYC signal 202 has been asserted after the initiation of state F and before the initiation of state A. This branch results in the CLK1 signal 30 remaining low for an additional three MASTER CLOCK signal 20 cycles to allow full and complete synchronization and to assure that the next rising edge of the CLK1 signal 30 does not appear too early.

The second exit from state F results in a feedback to state A and occurs if the MYCYC signal 202 has not been asserted. If 40 MHz is the MASTER CLOCK signal 20 frequency this loop results in the 2:3 proportion necessary for use with the odd divide circuit OD to produce a 50% duty cycle output clock signal. If 48 MHz is the active frequency, this feedback to state A results in three states in which the CKL1 signal 30 is high and three states in which the CKL1 signal 30 is low, thereby dividing by six such that a 50% duty cycle, 8 MHz CKL1 signal 30 is produced.

The third and final exit from state F occurs if 48 MHz is the active MASTER CLOCK signal 20 frequency and the MYCYC signal 202 has been asserted. In this case, the state machine S moves to state G, which has a value of 110. From state G the state machine S transfers to state D for feedback so that an additional four cycles are presented in the 48 MHz case where the MYCYC signal 202 was asserted after state F was entered and before state A was entered.

Upon entry to state D and only if the MYCYC signal 202 has been asserted, a signal referred to as BCD* (FIG. 7A) is developed to indicate that a synchronized cycle is being developed or initiated. This BCD* signal 346 is then clocked into a bistable multivibrator or flip-flop 350 by the MASTER CLOCK signal 20 to develop the BEGCYC signal 340 which is used by portions of the circuitry (not shown) to clear the MYCYC signal 202 so that a continuous loop in the state machine S does not occur.

Therefore it can be seen that the state machine S determines the active MASTER CLOCK signal 20 frequency and accordingly divides the MASTER CLOCK signal 20 by the desired amount, and when used in combination with the odd divide circuit OD, produces a 50% duty cycle output clock signal have an 8 MHz frequency. Additionally, the state machine S provides the capability for delaying the next rising edge of the CKL1 signal 30 until a given time after the occurrence of a synchronization request to provide for proper synchronization of the CKL1 output signal 30 with the MASTER CLOCK signal 20 or external conditions. The state machine S determines when the synchronization request has occurred relative to the location in the state machine S and appropriately adds a sufficient number of states so that the synchronization occurs as necessary.

Figure 7A:
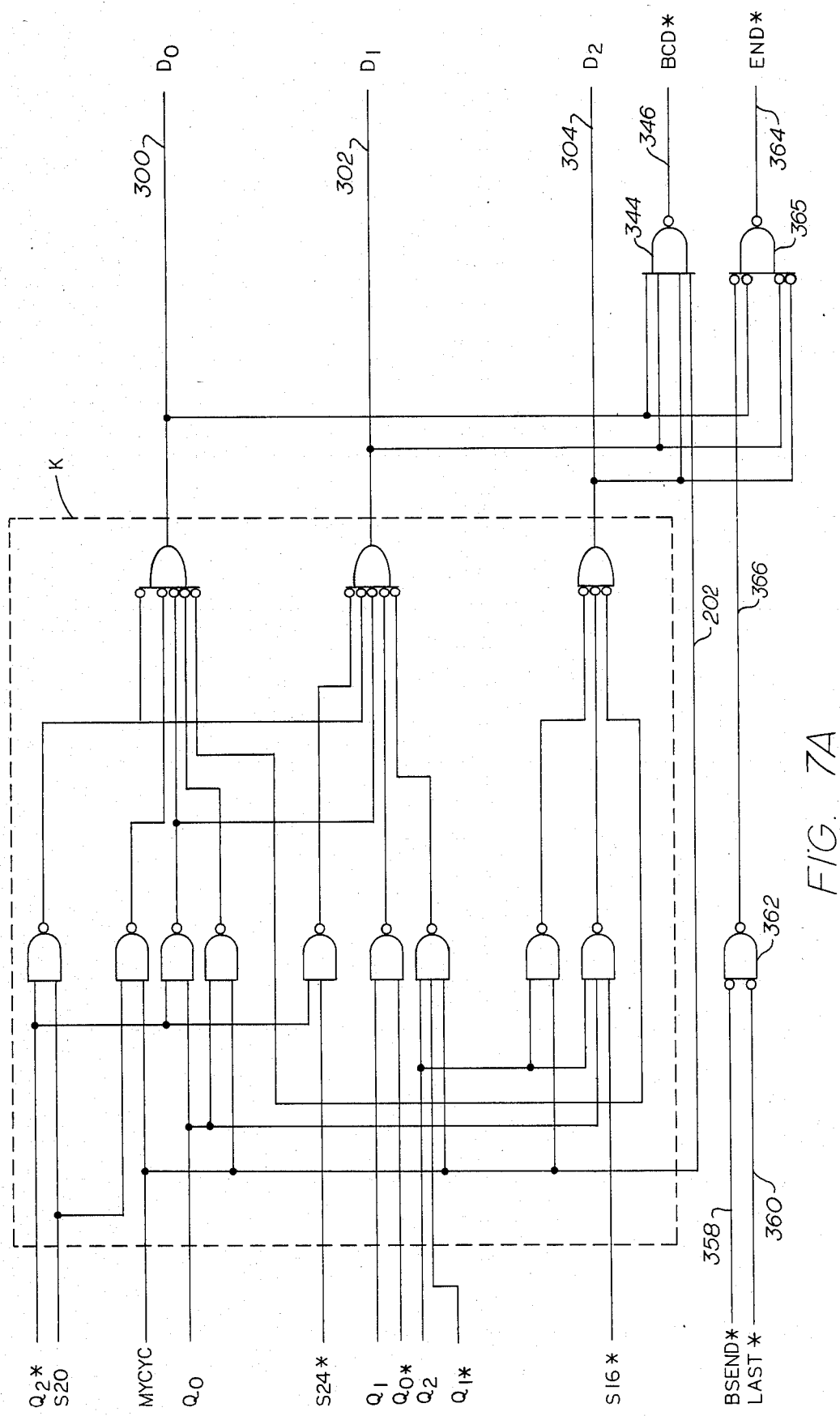
FIGS. 7a and 7b are electrical schematic diagrams of circuitry according to the present invention.
Figure 7B:
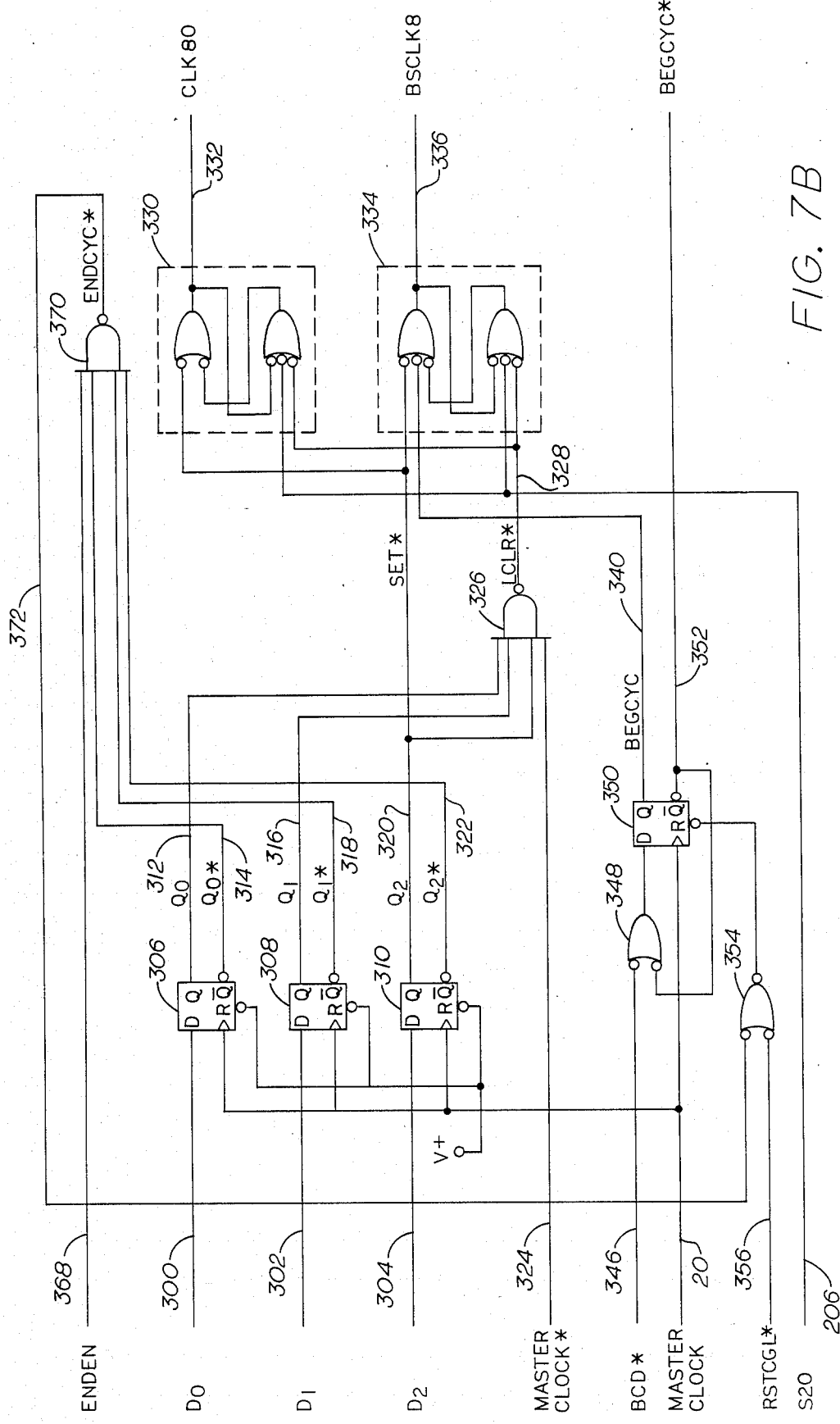

Referring now to FIGS. 7a and 7b which show more detailed logic diagrams of a circuit according to the present invention, the block K generally refers to the logic used to implement the Karnaugh maps of FIGS. 6b–6d and no further explanation of the operation of the circuitry is considered necessary, the operation being considered obvious to those skilled in the art.

The Karnaugh map logic K produces three output signals 300–304 which correspond to the D0, D1 and D2 Karnaugh maps. The D0–D2 output signals 300–304 are applied to the inputs to D-type bistable multivibrators or flip-flops 306–310 which comprise the storage elements in the synchronous state machine S. The MASTER CLOCK signal 20 is applied to the clocking input of the flip-flops 306–310 to provide the clock used to advance the state machine S through its various states. The flip-flops 306–310 produce respective true and inverted output signals corresponding to the values of Q0, Q1 and Q2, said signals being signals 312–322. The Q2 output 320 corresponds to the SET* signal 26 in the odd divide circuit OD.

The Q0 signal 312, the Q1 signal 316 and the Q2 signal 320 are combined in addition to a MASTER CLOCK* signal 324 in NAND gate 326 to produce an LCLR* signal 328. The LCLR* signal 328 corresponds to the signal provided to input 46 of the S-R latch 32 of the odd divide circuit OD. The SET* signal 320 and the LCLR* signal 328 are provided to a bistable multivibrator or S-R latch 330, which has an output of a CLK80 signal 332 and a bistable multivibrator or S-R latch 334, which has an output of a BSCLK8 signal 336. The SET* signal 320 is provided to one input of the S-R latches 330, 334 such that when the SET* signal 320 goes low the appropriate output signal 332, 336 goes high.

The LCLR* signal 28 is combined in S-R latch 330 with the S20 signal 206 which indicates that 40 MHz is the MASTER CLOCK signal 20 frequency. If the MASTER CLOCK signal 20 has a frequency of 40 MHz, the S20 signal 206 has a high value so that S-R latch 330 acts such that when the LCLR* signal 328 goes low and the SET* signal 320 is high, the CLK80 signal 332 goes low, so that the operation of the SET* and LCLR* signals 320, 328 control the operation of the CLK80 signal 332. If the S20 signal 338 is low, indicating that the MASTER CLOCK signal 20 frequency is 32 or 48 MHz, the operation of the LCLR* signal 328 on the S-R latches 330, 334 is disabled. This results in the CLK80 signal 332 of S-R latch 330 being an inverted version of the SET* signal 320. Therefore in the 32 and 48 MHz cases, the CLK80 signal 332 is developed from the SET* signal 320 which is derived from the state machine S as previously described.

The other S-R latch 334 differs from the previous S-R latch 330 which produces the CLK80 signal 332 in that the BSCLK8 signal 336 is active only during a synchronized cycle. This is performed by having the BEGCYC signal 340 applied in combination with the SET* signal 320 so that if the BEGCYC signal 340 is high, the S-R latch 334 operates in a like manner as the S-R latch 330 in that the states of the SET* signal 320, the LCLR* signal 328 and the S20 signal 206 control the BSCLK8 signal 336. If the BEGCYC signal 340 is low, the BSCLK8 signal 336 is always at a high level.

If the next state of the state machine S is state D, the D0, D1 and D2 signals 300–304 each have a value of 1. These three signals 300–304 are combined with the MYCYC signal 342 in a NAND gate 344 to produce the BCD* signal 346. The BCD* signal 346 is supplied to one input of a two input NAND gate 348 whose output is clocked to a D-type bistable multivibrator or flip-flop 350 which is used to develop the BEGCYC signal 340 and the BEGCYC* signal 352. The BEGCYC* signal 352 is the second input to the NAND gate 348 so that a latched condition can result. The MASTER CLOCK signal 20 is provided to the clocking input of the flip-flop 350. The BEGCYC signal 340 is used to enable the switched BSCLK8 signal 336. The BEGCYC* signal 352 is additionally used by external circuitry (not shown) to disable or terminate the MYCYC signal 202 to prevent looping of the state machine S.

The BEGCYC flip-flop 350 is cleared by the output of a two input AND gate 354. The first input to the two input AND gate 354 is the RSTCGL* signal 356 which corresponds to a power good signal to indicate that the power supply is in a condition allowing satisfactory operation of the device. The other input to the AND gate 354 is provided with a signal which indicates that the end of a synchronization mode sequence has been reached.

A BSEND* signal 358 and a LAST* signal 360 are combined in an OR gate 362 to provide an output signal which is used in combination with the D0, D1 and D2 output signals 300–304 by an OR gate 365 to produce an END* signal 364 when all five of the signals are in a low state, the END* signal 364 going low to indicate that the last synchronization cycle is ending. The BSEND* signal 358 indicates the end of a cycle of the synchronized 8 MHz cycle while the LAST* signal 360 indicates that this is the last cycle in a series of synchronized 8 MHz cycles. Therefore the combination of the BSEND* and LAST* signals 358 and 360 indicates that synchronization is ending. This ending signal 366 is used in combination with a 000 value or planned entry into state A of the state machine S to produce the END* signal 364. The END* signal 364 is processed by external circuitry (not shown) to produce an ENDEN signal 368 which indicates that it is appropriate to end the synchronization cycle. This ENDEN signal 368 is combined with the Q0*, Q1* and Q2* signals 314, 316, 322 in a NAND gate 370 to produce the ENDCYC* signal 372 which is applied to the second input of the AND gate 344 to clear the BEGCYC flip-flop 350. In this manner, a series of synchronized cycles can be easily developed and ended.

While the preferred embodiment hereabove described uses a divided output clock frequency of 8 MHz and is based on master clock frequencies of 32, 40 or 48 MHz corresponding to processor frequencies of 16, 20 or 24 MHz, it is understood that the frequencies of operation and therefore the number of required states in the state machine used in the state machine S or in the odd divide circuit OD can be changed as necessary.

The foregoing disclosure and description of the invention are illustrative and explanatory thereof, and various changes in the size, shape and materials as well as in the details of the illustrated construction may be made without departing from the spirit of the invention, all such changes being contemplated to fall within the scope of the appended claims.

I claim:

1. A circuit for providing an output clocking signal having a frequency which is an odd integer division of an input clocking signal, comprising:
   means for dividing the input clocking signal by an odd integer value to provide an output clocking signal having a duty cycle substantially of the proportion n:n+1 cycles, where 2n+1 is the division value and
   means for extending said n portion by $\frac{1}{2}$ clock cycle and reducing said n+1 portion by $\frac{1}{2}$ clock cycle to provide an output signal having a duty cycle substantially of an n+½:n+½ proportion, wherein said dividing means include means for producing a signal for enabling said n portion of the output clocking signal and means for producing a signal for enabling said n+1 portion of the output clocking signal.

2. The circuit of claim 1, wherein said extending means include means for delaying said n+1 portion enabling signal for ½ clock cycle.

3. The circuit of claim 2, wherein
said means for dividing further includes a bistable multivibrator;
said means for enabling said n portion includes means for providing a pulse signal to set said multivibrator; and
said means for enabling said n+1 portion includes means for providing a pulse signal to clear said multivibrator.

4. The circuit of claim 3, wherein the pulse signals are at least one clock cycle in length.

5. A circuit for dividing a master clock signal having an approximately 50% duty cycle by an odd integer value defined by 2n+1 and producing an approximately 50% duty cycle output clock signal, comprising:
a bistable multivibrator having two inputs and at least one output;
means for setting said multivibrator to a first state for n counts of the master clock;
means for clearing said multivibrator to a second state for n+1 counts of the master clock; and
means for disabling said clearing means for ½ count of the master clock.

6. The circuit of claim 5, wherein said means for setting and means for clearing comprises a state machine for providing a set output signal and a clear output signal.

7. The circuit of claim 6, wherein said state machine provides a pulse on said set output signal to set said multivibrator and said state machine provides a pulse on said clear output signal to clear said multivibrator.

8. The circuit of claim 7, wherein said means for disabling comprises means for combining said clear output signal and the master clock signal for disabling said clear output signal for the first ½ count of the master clock signal during which said clear output signal is active.

9. The circuit of claim 8, wherein said combining means comprises a NAND gate means and means for inverting the master clock signal, which inverted signal is provided to said NAND gate.

10. A circuit for providing a synchronized output clock signal derived by dividing down from one of a plurality of master clock signals having different frequencies, the output clock signal having a high and a low portion, and for providing an output clock signal wherein the rising edge of the clock signal immediately following a triggering event is limited to a prescribed interval, comprising:
means for determining which of the plurality of master clocks is active;
means for determining if the triggering event has occurred;
means for determining the number of master clock cycles the low state of the output clock signal must be extended for synchronization based on which master clock is active and the occurrence of the triggering event; and
means for extending the low state of the output clock signal and delaying the next rising edge of the output clock signal by the determined number of master clock cycles.

11. The circuit of claim 10, further comprising a state machine having a plurality of states, and wherein
one of said states enables the rising edge of the output clock signal,
one of said states enables the falling edge of the output clock signal, and
the number of states occurring after said falling edge state and before said rising edge state is variable depending on the active master clock frequency and the state at which the triggering event occurred.

12. The circuit of claim 11, wherein the number of states between said rising edge state and said falling edge state varies depending on the active master clock frequency.

13. The circuit of claim 12, wherein said state machine is adapted to accommodate three master clock frequencies having the proportion 4:5:6.

14. A circuit for providing asynchronized output clock signal derived from dividing one of a plurality of master clock signals having different frequencies and having approximately 50% duty cycles by an odd integer value to provide an approximately 50% duty cycle, synchronized output clock signal wherein the rising edge of the output clock signal immediately following a triggering event is limited to a prescribed interval, comprising:
a bistable multivibrator having two inputs and at least one output;
means for setting said multivibrator to a first state for n counts of the master clock;
means for clearing said multivibrator to a second state for n+1 counts of the master clock; and
means for disabling said clearing means for ½ count of the master clock;
said means for setting and means for clearing comprising a state machine having set and clear output signals and having a plurality of states,
one of said states enabling the rising edge of the output clock signal,
one of said states enabling the falling edge of the output clock signal, and wherein
the number of states occurring after said falling edge state and before said rising edge state varies depending on the active master clock frequency and the state at which the triggering event occurred 15. The circuit of claim 14, wherein said disabling means comprises means for combining said clear output signal and the master clock signal to disable said clear output signal for the first ½ count of the master clock during which said clear output signal is active.

16. The circuit of claim 14, wherein the number of states between said rising edge state and said falling edge state varies based on the active master clock frequency.

17. A method for providing an output clocking signal having a frequency which is an odd integer division of an input clocking signal, comprising:
dividing the input clocking signal by an odd integer value to provide an output clocking signal having a duty cycle substantially of the proportion n:n+1 cycles, where 2n+1 is the division value and
extending said n portion by ½ clock cycle and reducing said n+1 portion by ½ clock cycle to provide an output signal having a duty cycle substantially of an n+½:n+½ proportion, wherein said dividing step includes producing a signal for enabling said n portion of the output clocking signal and producing a signal for enabling said n+1 portion of the output clocking signal.

18. The method of claim 17, wherein said extending step includes delaying said n+1 portion enabling signal for ½ clock cycle.

19. The method of claim 18, wherein:
said dividing step utilizes a bistable multivibrator;
said enabling said n portion step includes providing a pulse signal to set said multivibrator; and
said enabling said n+1 portion step includes providing a pulse signal to clear said multivibrator.

20. The method of claim 19, wherein the pulse signals are at least one clock cycle in length.

21. A method for dividing a master clock signal having an approximately 50% duty cycle by an odd integer value defined by 2n+1 and producing an approximately 50% duty cycle output clock signal, utilizing a bistable multivibrator having two inputs and at least one output, comprising:
setting said multivibrator to a first state for n counts of the master clock;
clearing said multivibrator to a second state for n+1 counts of the master clock; and
disabling said clearing of said multivibrator for ½ count of the master clock.

22. The method of claim 21, wherein said setting step includes providing a set output signal and said clearing step includes providing a clear output signal.

23. The method of claim 22, wherein said set output signal and said clear output signal are pulses.

24. The method of claim 23, wherein said disabling step comprises combining said clear output signal and the master clock signal for disabling said clear output signal for the first ½ count of the master clock signal during which said clear output signal is active.

25. A method for providing a synchronized output clock signal derived by dividing down from one of a plurality of master clock signals having different frequencies, the output clock signal having a high and a low portion, and for providing an output clock signal wherein the rising edge of the clock signal immediately following a triggering event is limited to a prescribed interval, comprising:
determining which of the plurality of master clocks is active;
determining if the triggering event has occurred;
determining the number of master clock cycles the low state of the output clock signal must be extended for synchronization based on which master clock is active and the occurrence of the triggering event; and
extending the low state of the output clock signal and delaying the next rising edge of the output clock signal by the determined number of master clock cycles.

26. The method of claim 25, utilizing a state machine having a plurality of states, and further comprising:
enabling the rising edge of the output clock signal depending on one of said states,
enabling the falling edge of the output clock signal depending on one of said states, and
varying the number of states occurring after said falling edge state and before said rising edge state depending on the active master clock frequency and the state at which the triggering event occurred.

27. The method of claim 26, further comprising varying the number of states between said rising edge state and said falling edge state depending on the active master clock frequency.

28. A method for providing a synchronized output clock signal derived from dividing one of a plurality of master clock signals having different frequencies and having approximately 50% duty cycles by an odd integer value to provide an approximately 50% duty cycle, synchronized output clock signal wherein the rising edge of the output clock signal immediately following a triggering event is limited to a prescribed interval, and utilizing a bistable multivibrator having two inputs and at least one output, comprising:
setting said multivibrator to a first state for n counts of the master clock;
clearing said multivibrator to a second state for n+1 counts of the master clock; and
disabling said clearing means for ½ count of the master clock;
said setting step and said clearing step utilizing a state machine having set and clear output signals and having a plurality of states,
enabling the rising edge of the output clock signal depending on one of said states,
enabling the falling edge of the output clock signal depending on one of said states, and
varying the number of states occurring after said falling edge state and before said rising edge state depending on the active master clock frequency and the state at which the triggering event occurred.

29. The method of claim 28, wherein said disabling step comprises combining said clear output signal and the master clock signal to disable said clear output signal for the first ½ count of the master clock during which said clear output signal is active.

30. The method of claim 28, further comprising varying the number of states between said rising edge state and said falling edge state depending on the active master clock frequency.

* * * * *

UNITED STATES PATENT AND TRADEMARK OFFICE
CERTIFICATE OF CORRECTION

PATENT NO. : 4,807,266
DATED : February 21, 1989
INVENTOR(S) : Mark Taylor

It is certified that error appears in the above-identified patent and that said Letters Patent is hereby corrected as shown below:

Column 9
Line 11, delete "wherein" and insert therefor -- wherein: --.

Column 10,
Line 23, delete "asynchronized" and insert therefor -- a synchronized --.
Line 50, delete "occurred" and insert therefor -- occurred. --.

Signed and Sealed this

Fifteenth Day of November, 2005

JON W. DUDAS
*Director of the United States Patent and Trademark Office*